United States Patent [19]

Sajiki

[11] Patent Number: 4,835,401
[45] Date of Patent: May 30, 1989

[54] APPARATUS FOR AUTOMATIC POSITIONING OF PRINTING FILM ON BASE FILM

[75] Inventor: Seigo Sajiki, Kawasaki, Japan
[73] Assignee: Yutaka Electric Company, Ltd., Kawasaki, Japan
[21] Appl. No.: 164,877
[22] Filed: Mar. 8, 1988

[30] Foreign Application Priority Data

Mar. 12, 1987 [JP] Japan .................. 62-57652

[51] Int. Cl.⁴ .................................. G01N 21/86
[52] U.S. Cl. ........................ 250/548; 356/401
[58] Field of Search ............. 250/548, 557; 356/400, 356/401

[56] References Cited

U.S. PATENT DOCUMENTS

| | | | |
|---|---|---|---|
| 4,496,241 | 1/1985 | Mayer | 250/548 |
| 4,524,280 | 6/1985 | Ishikawa | 250/548 |
| 4,641,198 | 2/1987 | Ohta et al. | 250/557 |

*Primary Examiner*—David C. Nelms
*Assistant Examiner*—Khaled Shami
*Attorney, Agent, or Firm*—Young & Thompson

[57] ABSTRACT

An apparatus for automatic positioning a printing film such as a color separation film on a transparent base film having centering holes including a main base having a flat top surface on which a white T-shaped guidance mark is formed and centering pins. At first the base film is placed on the top surface of main table such that the centering pins are inserted into the centering holes, and then the printing film is placed on the base film such that right and left horizontal register marks and a vertical register mark formed on the printing film are roughly aligned with the T-shaped guidance mark. After measuring the distance from home position to the left and right register marks, one of two air pads is operated to move the printing film such that the horizontal register marks are brought in parallel with the line connecting the centers of centering pins. Then the printing film is moved forward to coincide the horizontal register marks with a line connecting the centers of centering pins. Next, the printing film is moved in the horizontal direction until the vertical register mark on the printing film is coincided with a perpendicular bisector with respect to the line connecting the centers of centering pins in such a way that the printing film is further moved leftward by a predetermined distance from the point at which the vertical register mark on the printing film is detected.

7 Claims, 8 Drawing Sheets

FIG_5

FIG_6

FIG.7B

APPARATUS FOR AUTOMATIC POSITIONING OF PRINTING FILM ON BASE FILM

BACKGROUND OF THE INVENTION

Field of the Invention and Related Art Statement

This invention relates to an apparatus for automatic positioning printing films such as color separation films on transparent base films.

In a preparatory step of printing process, a printing film having a picture formed thereon has to be sticked on a transparent base film accurately at a predetermined position thereon.

Figure 1A:
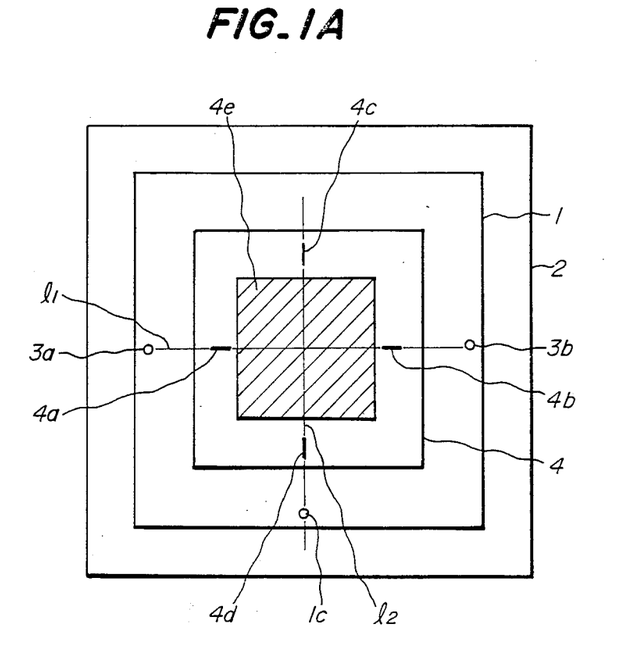
FIGS. 1A and 1B are plan and cross sectional views, respectively illustrating the method of positioning the printing film on the base film.
Figure 1B:
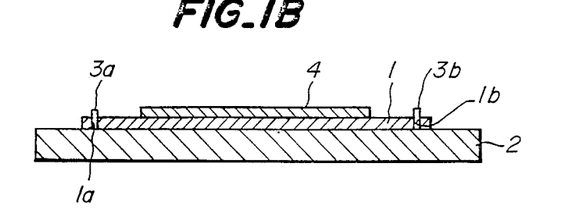

As illustrated in FIGS. 1A and 1B, a transparent base film 1 has formed therein a plurality of centering holes $1a$, $1b$ and $1c$ and is placed on a table 2 having centering pins $3a$ and $3b$ in such a manner that the pins $3a$ and $3b$ are inserted into the holes $1a$ and $1b$, respectively. It should be noted that the table 2 may have an additional centering pin which is to be inserted into the hole $1c$ of the base film 1. A printing film 4 has a smaller size than the base film 1 and includes four register marks $4a$ to $4d$ formed outside a pictorial area $4e$. Usually, the register marks $4a$ to $4d$ are formed by fine lines each having a width of 0.04 to 0.2 mm. The register marks $4a$ to $4d$ on the printing film are formed in such a manner that a horizontal line connecting the horizontally aligned marks $4a$ and $4b$ intersects orthogonally with a vertical line connecting the vertically aligned marks $4c$ and $4d$ at a center of the pictorial area $4e$.

On the surface of table 2 these are formed two mutually orthogonal imaginary lines $l_1$ and $l_2$, the line $l_1$ connecting the centers of centering pins $3a$ and $3b$ and the line $l_2$ being a perpendicular bisector with respect to the line $l_1$. The printing film 4 has to be positioned on the base film 1 at such a position that the register marks $4a$ and $4b$ are coincided with the line $l_1$ as well as the register marks $4c$ and $4d$ are coincided with the line $l_2$.

In the former known method, after the base film 1 has been placed on the table 2 in position, the printing film 4 is positioned on the base film 1 by inspecting the register marks $4a$ to $4d$ on the printing film and the actually described centering lines $l_1$ and $l_2$ on the table 2 with the aid of a magnifying lens usually having a magnification of ten.

After the printing film 4 has been positioned on the base film 1 precisely at the given position thereof, the printing film is fixed onto the base film by means of an adhesive tape. In order to obtain clear and sharp multicolor printings, four color separation films have to be placed on respective base films with an accuracy smaller than $\pm 20$ $\mu$m, preferably smaller than $\pm 15$ $\mu$m of repeatability. In practice, it is quite difficult to coincide manually the register marks $4a$ to $4d$ with the lines $l_1$ and $l_2$ accurately with the aid of the magnifying lens, and this operation requires experienced labor work and a long time period. Further, due to the fatigue of eyes of operator, the precision of the centering might be decreased, so that the quality of printed matters might be deteriorated.

SUMMARY OF THE INVENTION

The present invention has for its object to provide a novel and useful apparatus for positioning precisely a printing film on a base film placed on a table in an automatic manner with an accuracy smaller than $\pm 20$ $\mu$m, preferably smaller than $\pm 15$ $\mu$m.

According to the invention, the apparatus for automatic positioning a printing film having formed first and second horizontal register marks and at least one vertical register mark on a transparent base film having a plurality of centering holes, comprises a main table having a flat top surface;

at least two centering pins provided on said top surface of main table, said centering pins being insertable into said centering holes formed in the base film and said centering pins being aligned in a first direction;

a first sensor unit including a first sensor head for detecting optically edges of said first horizontal register mark on the printing film, a first air pad for sucking the printing film onto a bottom surface thereof, and a first device for moving the air pad up and down;

a second sensor unit including a second sensor head for detecting optically edges of the second horizontal register mark on the printing film, a second air pad for sucking the printing film onto a bottom surface thereof, and a second device for moving the air pad up and down;

a first driving unit for moving said first sensor unit in parallel with said top surface of the main table in a second direction perpendicular to said first direction;

a second driving unit for moving said second sensor unit in parallel with said top surface of the main table in said second direction;

a third sensor unit including a third sensor head for detecting optically edges of said vertical register mark on the printing film, said third sensor unit being movable in said second direction;

a slide table for supporting said first and second sensor units and first and second driving units;

a third driving unit for moving said slide table in parallel with said top surface of main table in said first direction; and a control unit for controlling said first and second air pad moving devices and said first, second and third driving units in such a manner that a first horizontal line connecting the first and second horizontal register marks on the printing film is brought in parallel with a second horizontal line connecting centers of said centering pins on the main table by operating one of the first and second driving units to move one of the sensor units in the second direction, said first horizontal line is concided with said second horizontal line by simultaneously operating said first and second driving units to move the printing film in the second direction, and then printing film is moved in the first direction until the vertical register mark on the printing film is coincided with a vertical line which is a perpendicular bisector with respect to said second horizontal line.

DESCRIPTION OF THE PREFERRED EMBODIMENTS

Figure 2:
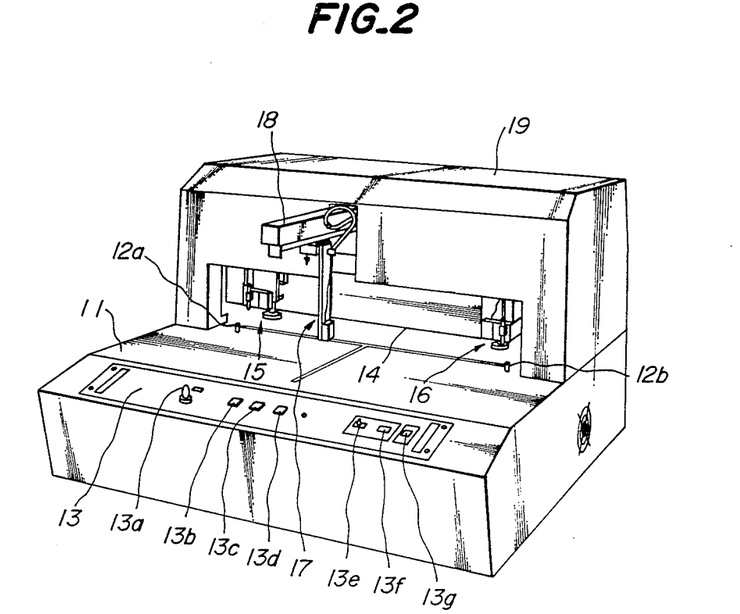
FIG. 2 is a perspective view showing an outer appearance of the positioning apparatus according to the invention.

FIG. 2 is a perspective view showing an outer appearance of an embodiment of the automatic film positioning apparatus according to the invention. The apparatus comprises a main table 11 having two centering pins 12a and 12b. It should be noted that one or more additional centering pins may be provided on the main table 11 at given positions thereof. The number of centering pins is determined in accordance with the specification of machine used in succeeding process. The apparatus further comprises an operation panel 13 on which there are provided various operation members such as power switch 13a, start button 13b, end lamp 13c, return button 13d, width switch 13e for moving sensor units horizontally, direction selecting switch 13f, and up/down switch 13g for moving the sensor units up and down. On the main table 11 there is provided a subtable 14 via spacers arranged at four corners thereof. Sub-table 14 secures space to insert the backward half part of films thereunder. The apparatus further comprises first, second and third sensor units 15, 16 and 17 arranged movably with respect to the main table 11. The sensor unit 17 is hanged from an arm 18 which extend horizontally in parallel with the main table 11. The sub-table 14 is covered with a hood 19.

Figure 3:
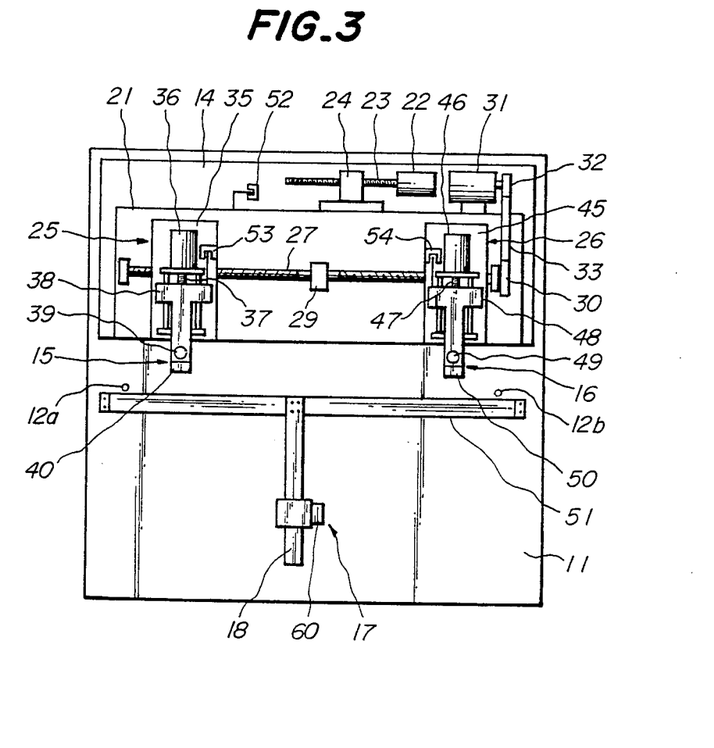
FIG. 3 is a plan view depicting the inside construction of the apparatus shown in FIG. 2.

FIG. 3 is a plan view showing the film positioning apparatus shown in FIG. 2, while the top hood 19 is removed. On the sub-table 14 there is arranged a slide table 21 movably in the right and left directions in FIG. 3. A stepping motor 22 is secured to the sub-table 14 and a lead screw 23 is coupled with the motor. To the slide table 21 is secured a nut 24 which is engaged with the lead screw 23. Therefore, by rotating the motor 22 in both directions, the slide table 21 is moved horizontallly in both directions on the sub-table 14. On the slide table 21, there are arranged first and second driving units 25 and 26 having the same construction. The first and second driving units 25 and 26 are coupled with a lead screw 27, respectively via nuts not shown. The lead screw 27 has two threads formed in opposite directions and are arranged symmetrically with respect to a center bearing 29 secured to the slide table 21. A pulley 30 is secured to a right hand end of the lead screw 27. An induction motor 31 is secured to the slide table 21 and a pulley 32 is fixed to an output shaft of the motor 31. Between the pulleys 30 and 32 there is arranged an endless belt 33. Therefore, when the motor 31 is driven in one direction to rotate the lead screw 27 in one direction, the driving units 25 and 26 are moved in such directions that they come closer to each other. On the contrary, when the motor 31 is driven in the opposite direction, the driving units 25 and 26 are moved far from each other, so that the distance between the sensor units 25 and 26 can be adjusted on the slide table 21.

In the driving unit 25, the sensor unit 15 is arranged movably in the to-and fro, i.e. back-and-forth directions. The driving unit 25 comprises a substrate 35, a stepping motor 36 arranged on the substrate, a lead screw 37 connected to an output shaft of the stepping motor, and a slider 38 having a nut engaged with the lead screw. The sensor unit 15 comprises an air pad 39 and a sensor head 40 secured to a front end of the slider. The second driving unit 26 have the same construction as that of the first driving unit 25 and comprises substrate 45, stepping motor 46, lead screw 47, and slider 48, and the sensor unit 16 comprises air pad 49 and sensor head 50 secured to a front end of the slider.

The third sensor unit 17 comprises a sensor head 60 and is movably secured to the arm 18. After the sensor unit 17 has been moved manually into a desired position along the arm 18, the sensor unit 17 may be locked at the relevant position on the arm. The arm 18 has one end secured to a center of a gate like frame member 51 which is secured to the main table 11.

The slide table 21 has a home position which is detected by a photointerruptor 52 secured to the subtable 14. The sliders 38 and 48 have their own home positions which are detected by photointerruptors 53 and 54, respectively secured to the substrates 35 and 45, respectively.

Figure 4:
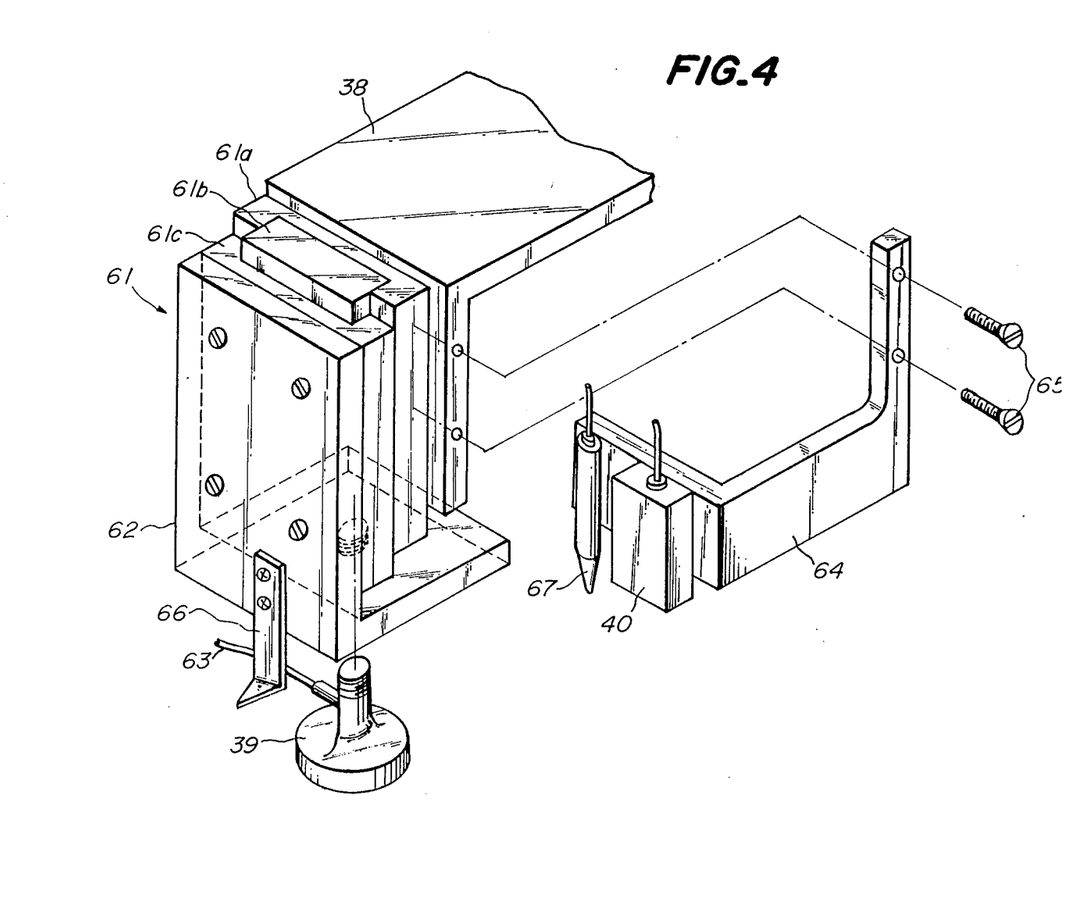
FIG. 4 is an exploded perspective view showing the construction of the sensor unit.

FIG. 4 is an exploded perspective view showing a detailed construction of the first sensor unit 15. It should be noted the construction of the second sensor unit 16 is similar to the first sensor unit 15. At the front end of the slider 38, there is secured an air pad driving device 61 including a base plate 61a secured to the slider, an air cylinder 61b secured to the base plate and a movable frame 61c secured to the air cylinder movably up and down. To the movable frame 61c there is secured an L-shaped bracket 62 on a bottom surface of which the air pad 39 is screwed. The air pad 39 has formed therein a conduit which is opened at a bottom flat surface of the air pad. The conduit is connected via a tube 63 to a suction pump.

To the slider 38, there is further secured a bracket 64 by means of screws 65, and the sensor head 40 is fixed to the bracket. Further, an L shaped indicator 66 is secured to the bracket 62 so that the indicator is moved up-and-down together with the air pad 39. To the bracket 64 there is secured a nozzle 67 for ejecting an air stream downward. The nozzle 67 serves to press down the printing film to the base film without disturbing the sliding movement of the printing film. The sensor head 40 is formed by a reflection type sensor projecting a light spot of a diameter of less than 0.1 mm which is sufficiently small with respect to the smallest thickness of the register mark on the printing film. The center of the air pad 39 and light spot from sensor head 40 are arranged to align on the same vertical line. Since the light spot is very small, it is impossible for an operator to recognize a point on the printing film upon which the light spot is made incident. Therefore, in the present embodiment, the indicator 66 having a sharp tip is provided in the sensor unit to indicate the position of light spot.

The third sensor unit 17 comprises the reflection type sensor head 60, a nozzle for ejecting an air stream downward and a manually operated indicator similar to the indicator 66.

The home positions of the sliders 38 and 48 of the first and second sensor driving units 25 and 26 are so determined that the detecting light spots of the sensor heads 40 and 50 situate at positions which are apart predetermined precise distance of more than 10 mm backward from the line $l_1$ connecting the centers of pins 12a and 12b. The home position of the slide table 21 is determined such that the center between both sensor heads 40 and 50 is apart about 10 mm rightward from the line $l_2$ which is a perpendicular bisector of the line $l_1$. It should be noted that the line $l_1$ and $l_2$ are not actually described but imaginary ones.

Figure 5:
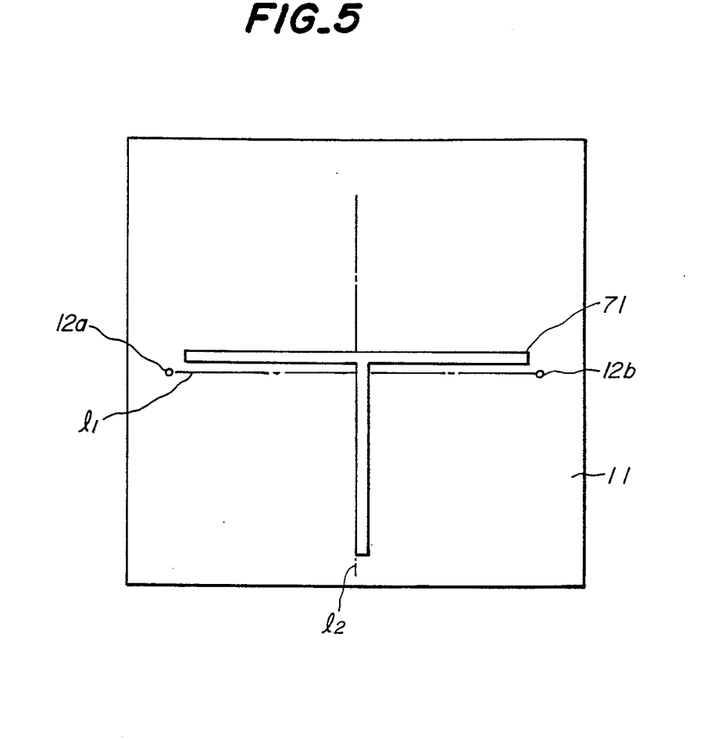
FIG. 5 is a plan view illustrating the T-shaped guidance mark formed on the main table.

As illustrated in FIG. 5, on the main table 11 there is formed a T-shaped guidance mark 71 to guide the position of manual setting of the printing film for automatic positioning, composed of white line having a width of about 10 mm. The white color of the mark 71 is also effective in increasing the contrast of image for optical detection by the sensor heads 40, 50 and 60. The horizontal line of T-shaped mark 71 is formed in parallel with the line $l_1$, and is situated such that the light spots of sensor heads 40 and 50 in home position come just a little inside of the white line from the back hand side edge thereof. The vertical line of the T-shaped mark 71 has a left hand side edge coincided with the line $l_2$. The third sensor unit 17 is aligned such that the light spot of sensor head 60 comes 2 or 3 mm inside of the white line from the left hand side edge thereof. By these arrangement, when slide table 21 is in home positione, the center of slide table will nearly coincide with the right hand side edge of the vertical white line.

Figure 6:
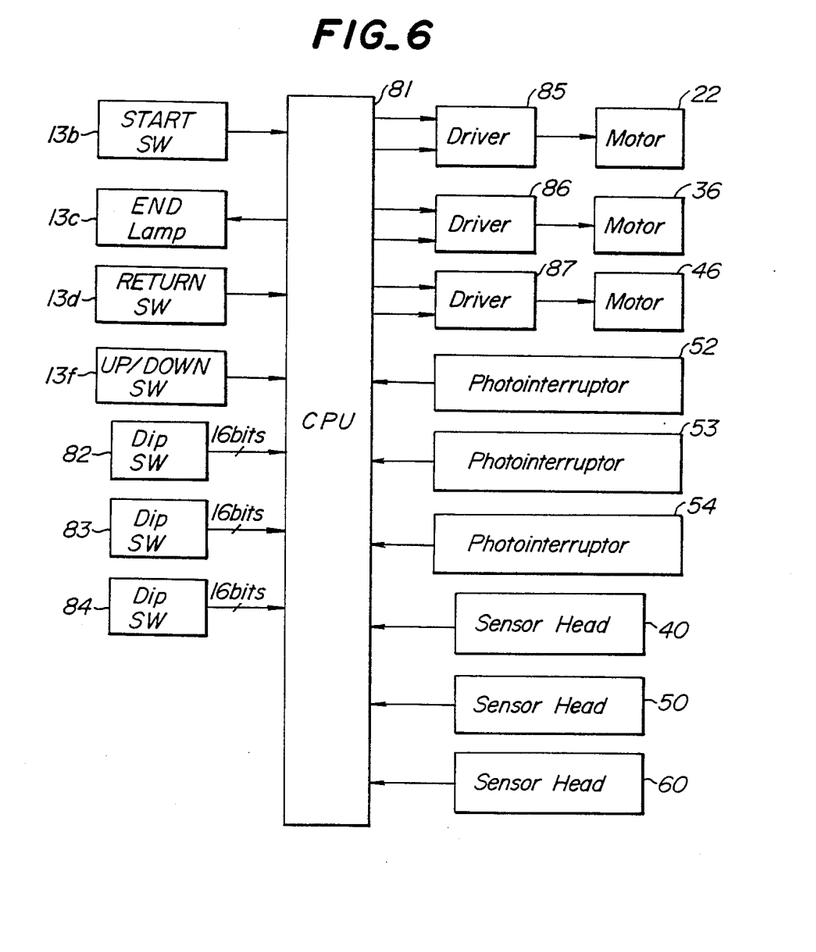
FIG. 6 is a block diagram representing the general construction of the control unit.

FIG. 6 is a block diagram showing a general construction of a control unit. The control unit comprises a central processing unit (CPU) 81 and I/O ports, interfaces, RAM and ROM not shown. The start button 13b, end lamp 13c, return button 13d, and up/down switch 13g provided on the panel 13 are connected to the CPU 81. Width switch 13e and direction select switch 13f are connected directly to the induction motor 31. The photo-interruptors 52, 53 and 54 for detecting the home position of the slide table 21 and sliders 35 and 45 are also connected to the CPU 81. Further, the detected signal from the sensor heads 40, 50 and 60 of the sensor units 15, 16 and 17 are also supplied to the CPU 81. In order to drive the steppting motors 22, 36 and 46 in both directions, there are provided motor drivers 85, 86, and 87 which are all connected to the CPU 81. As explained above, the home positions of the sliders 38 and 48 are set such that the light spots of the sensor heads 40 and 50 are situated at positions separated from the line $l_1$ connecting the centers of the centering pins 12a and 12b by precisely determined distances. However, in practice, it is difficult to attain such an arrangement accurately and there are always a little errors in said distances. In order to compensate or correct such errors, there are provided the dip switches 82 and 83 corresponding to left and right sensors, to set the sign and magnitude of errors measured beforehand, each generating an output signal of 16 bits. Therefore, each of the dip switches 82 and 83 are connected to the CPU 81 via sixteen parallel lines. The third dip switch 84 is provided to set the distance measured beforehand from the light spot of the sensor head 60 to the position at which the vertical register mark on the printing film has to be stopped. This dip switch 84 is connected to the CPU 81 also via sixteen parallel lines.

Figure 7A:
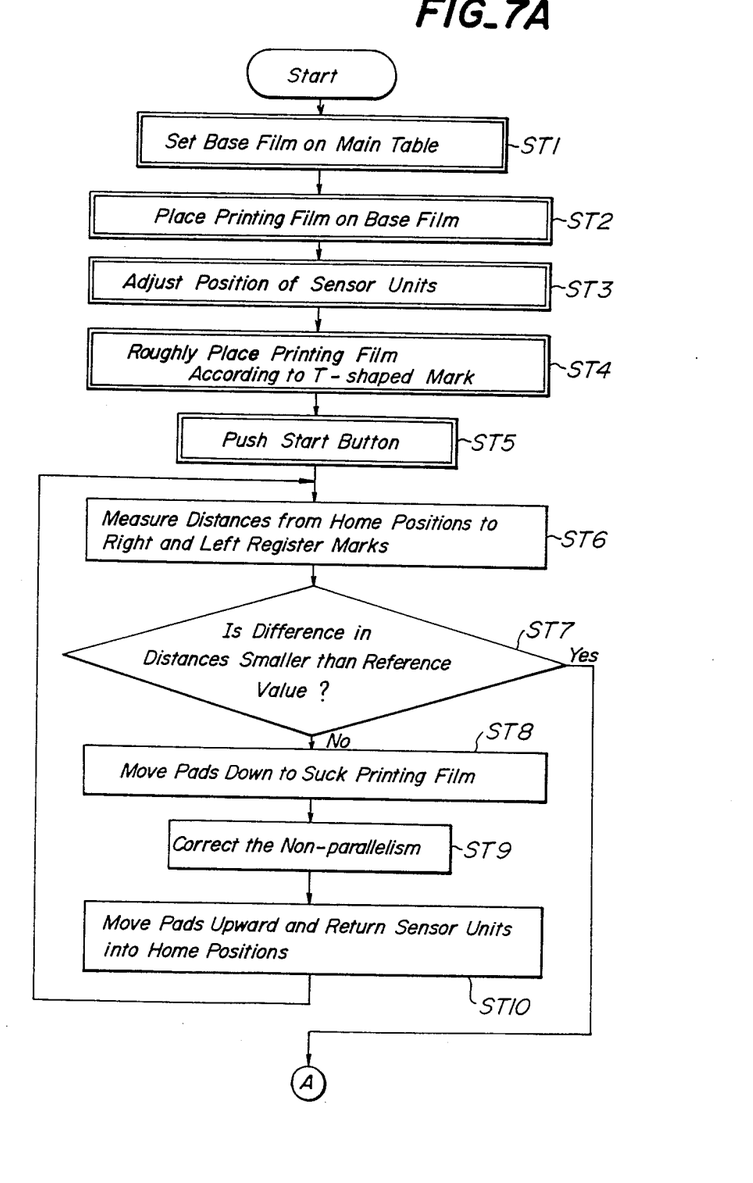
FIGS. 7A and 7B are general flow charts representing principal operation steps of the apparatus shown in FIG. 2.
Figure 7B:
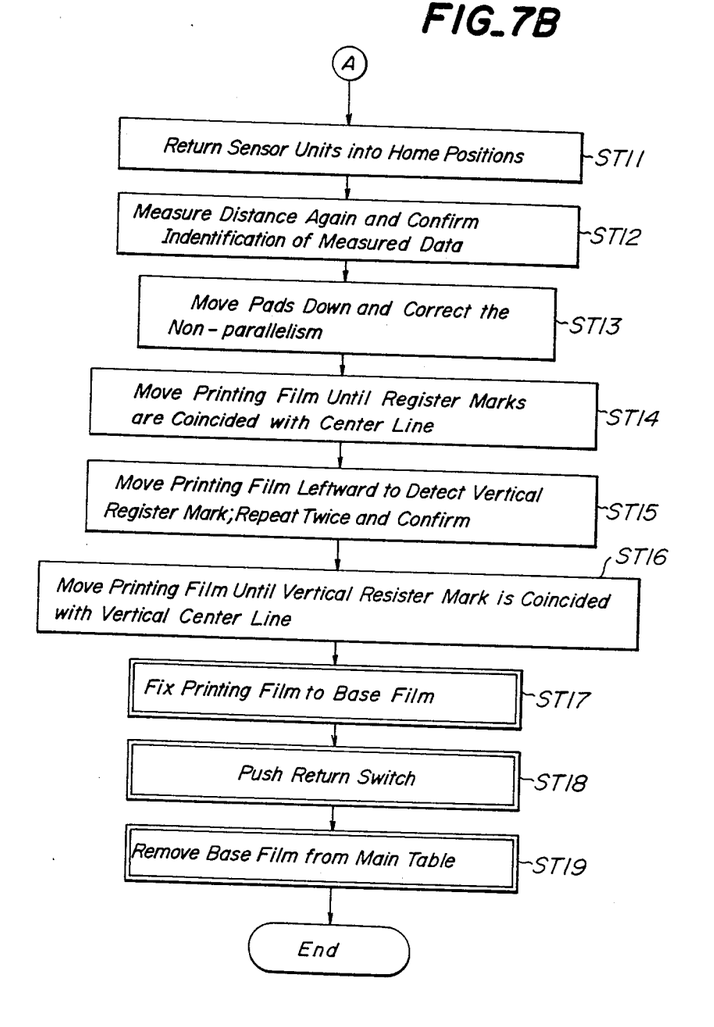

Now the operation for positioning the printing film o the base film will be explained also with reference to a flow chart illustrated in FIGS. 7A and 7B. In FIGS. 7A and 7B, manual steps are denoted by double frames.

At first the base film is placed on the main table 11 such that the centering pins 12a and 12b on the main table are inserted into the centering holes formed in the base film (ST1).

Then the positions of the sensor heads 40,50 and 60 must be adjusted according to the dimension of the printing film so that all of the sensors 40, 50 and 60 can detect the respective register marks on the printing film without missing. For this purpose the printing film is put on the base film (ST2). Adjustment is done by comparing the positions of the light spots with the actual positions of the register marks on the printing film (ST3). Width between sensors 40 and 50 is adjusted by operating direction select switch 13f and width switch 13e. The position of the sensor 60 is adjusted manually and is clumped when it is completed. Once the positions of the sensor heads are adjusted it is unnecessary to repeat it so long as the dimension of the printing film is not changed. At these adjustment it is preferable to move the air cylinders (61b) downward by operating up/down switch 13g, or by manual operation as for the sensor 60. The position of the light spots, because they are very small and almost invisible, are indicated by the indicator (66) and by moving downward the indicator it becomes easy to compare the position of the light spots with that of the register mark. It should be noted that even in the down-position, the air pads and indicators are not brought into contact with the printing film, so that the printing film may be moved without interrupted by the air pads and indicators.

Now the printing film has to be replaced roughly at the starting position for automatic positioning (ST4). The horizontal register marks on the printing film are situated inside the horizontal line of the T-shaped guidance mark 71 formed on the main table 11 and the vertical register mark on the printing film is situated near the right hand edge of the vertical line of the T-shaped mark 71.

At start, the slide table 21 and sliders 38 and 48 are situated at their home positions respectively, and air pads 39 and 49 are in the up-positions.

After the printing film has been roughly positioned on the base film as explained above, the start button 13b is pushed (ST5). Then the CPU 81 supplies identical driving pulses to the motor drivers 86 and 87 which then supply driving power to the stepping motors 36 and 46, respectively. In this manner, the sliders 38 and 48, and thus the sensor heads 40 and 50 are moved forward. At the same time, in the CPU 81, the number of generated driving pulses are counted up. Therefore, count values in counter represent distances over which the sliders 35 and 45 are moved. During the movement, the sensor heads 40 and 50 detect front and rear edges of the respective horizontal register marks on the printing film, while the air streams are ejected from the nozzles. The count values in the counter are read out and recorded in response to these edge signals. Therefore, distances from the reference position, i.e. the home position to the front and rear edges of the horizontal register mark on the printing film can be measured. Driving pulses are stopped at the time when the late coming rear edge signal of sensors 40 and 50 is received. Then, after correcting the obtained data by the error value due to the home position error read from dip switches 82 and 83, an average value of front and rear edge distances is calculated to derive a distance from the home position to a center of the horizontal register mark. In this manner, the distances between the home positions to the centers of the right and left hand horizontal register marks on the printing film can be derived in regardless to the thickness of the register marks and the diameters of the light spots of the sensor heads (ST6). Usually, the horizontal centering lines of the printing film are placed not in parallel with the line $l_1$ connecting the centers of the centering pins 12a and 12b on the main table 11, and thus the above two distances are not identical with each other. In order to correct such a non-parallelism, there is derived a difference between said distances and the difference thus derived is compared with a predetermined small reference value (ST7). When the difference exceeds the reference value, the air cylinders (61b) of the first and second sensor units 15 and 16 are actuated to move the air pads 39, 40 downward. Then, the suction air is applied to the inside of the air pads via the tubes (63), so that the printing film is sucked onto the lower surfaces of air pads (ST8). Next, the CPU 81 sends a driving pulses to one of the motor drivers 86 and 87 to energize one of the stepping motors 36 and 46 in such a manner that said difference becomes zero (ST9). That is to say, one of the sensor units 15 and 16 which indicates a smaller distance from the home position to the center of the centering line is further moved forward by a distance corresponding to said difference in the distances. During this operation, another air pad is kept stopped and sucking the printing film, so that it acts as the center of rotation of the printing film.

When only one of the sensor units 15 and 16 is moved, the printing film is distorted. In order to remove the distortion of the printing film, the suction air to the air pads 40 and 50 is interrupted and the air cylinders (39) are deenergized to move the air pads upward. Then, the CPU 81 supplies the signals to the motor drivers 87 and 88 and the sliders 38 and 48 are returned into the home positions (ST10). When the suction air to the air pads 40 and 50 is interrupted, the printing film is released from the air pads and the printing film might move slightly. Due to this slight movement, the horizontal centering lines on the printing film might again become out of parallel a little from the line $l_1$ connecting the centers of the centering pins 12a, 12b. Then, the stepping motors 36 and 46 are energized again to move the sliders 38 and 48 forward, and the distances from the home positions to the centers of the right and left register marks on the printing film are measured once again. If the distances thus detected show a difference exceeding the reference value, the above explained correcting operation is repeated. When the difference between the distances is smaller than the reference value, the sliders 38 and 48 are once again returned into the home positions without correcting the non-parallelism (ST11), and then the distances from the home positions to the centers of the register marks on the printing film are measured again. The distances thus detected are then compared with the previously measured distances (ST12). When these distances are not identical with each other, it is assumed that any measuring error might occur and a series of steps explained above is repeated again. When the distances are identical with each other, there is derived a difference between the right and left side distances. It is apparent that this difference is smaller than the reference value. Then one of the stepping motors 36 and 46 is driven such that the difference becomes zero, while the air pads are moved down and the printing film is sucked onto the air pads 39 and 49 (ST13). Since said difference is very small, any distortion of the printing film due to said movement could be neglected.

Keeping the printing film being sucked, the CPU 81 calculates a distance from current position of the register mark line on the printing film to the line $l_1$ connecting the centers of the centering pins 12a, 12b on the main table 11. Then the CPU 81 supplies driving pulses corresponding to the calculated distance to the motor drivers 86, 87 to drive the motors 36, 46 until the center of the centering line on the printing film is coincided with the center line $l_1$ connecting the centers of the centering pins 12a, 12b (ST14).

Next, the CPU 81 sends a signal to the motor driver 85 to drive the motor 22 such that the slide table 21 and thus the printing film are moved leftward in FIG. 3. During this movement, the sensor head 60 of the third sensor unit 17 detects edges of the vertical register mark on the printing film. By averaging count values of the counter at the detection of said edges, it is possible to detect a distance between the vertical register mark in the home position to a center of the light spot of the sensor head 60. This step is repeated twice and the two distances thus derived are compared with each other to confirm the accuracy of the detection (ST15). If these distances are not identical with each other, the automatic positioning operation is repeated from the start. When these distances are equal to each other, the CPU 81 sends a signal to the motor driver 85 to drive the motor 22 so that the slide table 21, and thus the printing film are further moved leftward by a predetermined distance previously entered into the CPU 81 by reading the dip switch 84. In this manner, the center of the vertical register mark on the printing film can be coincided with the perpendicular bisector $l_2$ to the horizontal centering line $l_1$ (ST16). After the above operation has been completed, the end lamp 13c on the panel 13 is lighted on. At the same time, a lamp provided in the return switch 13d is also lighted on to indicate that the return switch is now in the active condition. After the printing film has been fixed onto the base film with the aid of the adhesive tape (ST17), the operator pushes the return switch 13d (ST18). Then the suction air applied to the air pads 39, 49 is interrupted, the air pads are moved upwards and then the slide table 21 and sliders 38 and 48 are moved into the home positions. The base film having the printing film fixed thereon can be easily removed from the main table 11 (ST19). In this manner, the apparatus is set into the preparatory condition for a next positioning operation.

As explained above in detail, in the apparatus according to the invention the printing film can be positioned automatically on the transparent base film placed on the main table in a very precise manner, and the registering error can be easily made smaller than ±15 μm of repeatability. Therefore, the positioning operation can be performed very simply in a very short time period, and further the quality of printed matters can be improved.

What is claimed is:

1. An apparatus for positioning automatically a printing film on a base film, said printing film having formed thereon first and second horizontal register marks and a vertical register mark and said base film having at least two centering holes formed therein, comprising
    a main table having a flat top surface;
    at least two centering pins provided on said top surface of main table, said centering pins being insertable into said centering holes formed in the base film and said centering pins being aligned in a first direction;
    a first sensor unit including a first sensor head for detecting optically edges of said first horizontal register mark on the printing film, a first air pad for sucking the printing film onto a bottom surface thereof, and a first device for moving the air pad up and down;
    a second sensor unit including a second sensor head for detecting optically edges of the second horizontal register mark on the printing film, a second air pad for sucking the printing film onto a bottom surface thereof, and a second device for moving the air pad up and down;

a first driving unit for moving said first sensor unit in parallel with said top surface of the main table in a second direction perpendicular to said first direction;

a second driving unit for moving said second sensor unit in parallel with said top surface of the main table in said second direction;

a third sensor unit including a third sensor head for detecting optically edges of said vertical register mark on the printing film, said third sensor unit being movable in said second direction;

a slide table for supporting said first and second sensor units and first and second driving units;

a third driving unit for moving said slide table in parallel with said top surface of main table in said first direction; and a control unit for controlling said first and second air pad moving devices and said first, second and third driving units in such a manner that a first horizontal line connecting the first and second horizontal register marks on the printing film is brought in parallel with a second horizontal line connecting centers of said centering pins on the main table by operating one of the first and second driving unit to move one of the sensor units in the second direction, said first horizontal line is coincided with said second horizontal line by simultaneously operating said first and second driving units to move the printing film in the second direction, and then printing film is moved in the first direction until the vertical register mark on the printing film is coincided with a vertical line which is a perpendicular bisector with respect to said second horizontal line.

2. An apparatus according to claim 1, further comprises an arm extending in parallel with the top surface of main table in said second direction for supporting said third sensor unit movably along the arm.

3. An apparatus according to claim 1, wherein said main table comprises a T-shaped white guidance mark, a horizontal stroke line of the T-shaped guidance mark being extending in said first direction and a vertical stroke line of the T-shaped guidance mark being extending in said second direction.

4. An apparatus according to claim 1, further comprising a fourth driving means for moving said first and second sensor units and first and second driving units in said first direction such that the first sensor and driving units and the second sensor and driving units are moved close to or apart from each other.

5. An apparatus according to claim 1, wherein each of said first and second driving units comprises a substrate, a stepping motor provided on the substrate, a lead screw coupled with an output shaft of the stepping motor, and a slider engaged with the lead screw and arranges slidably in the first direction, said sensor head and air pad being secured to said slider such that a slight spot emitted from the sensor head and a center of the air pad are aligned on a vertical line.

6. An apparatus according to claim 4, wherein each of said first and second sensor units further comprise an indicator secured to the air pad and having a sharp tip which indicates a position of a light spot emitted from the sensor head, and said third sensor unit comprises an indicator having a sharp tip for indicating a position of a light spot emitted from the sensor head, said indicator being manually movable up and down.

7. An apparatus according to claim 5, wherein each of said first, second and third sensor units further comprises a nozzle for ejecting an air stream against the printing film to press down it to the base film without disturbing the sliding movement of the printing film.

* * * * *